United States Patent
Nunan et al.

(10) Patent No.: US 7,151,018 B1
(45) Date of Patent: Dec. 19, 2006

(54) METHOD AND APPARATUS FOR TRANSISTOR SIDEWALL SALICIDATION

(75) Inventors: Peter D. Nunan, Monte Sereno, CA (US); Sergey D. Lopatin, Santa Clara, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/989,911

(22) Filed: Nov. 15, 2004

(51) Int. Cl.
*H01L 21/338* (2006.01)
*H01L 21/4763* (2006.01)

(52) U.S. Cl. .................. 438/176; 438/635; 438/637
(58) Field of Classification Search .......... 438/176, 438/694, 635, 653, 584, 597, 637
See application file for complete search history.

(56) References Cited

U.S. PATENT DOCUMENTS

| | | | |
|---|---|---|---|
| 6,015,747 A | 1/2000 | Lopatin et al. | |
| 6,413,802 B1 | 7/2002 | Hu et al. | |
| 6,630,721 B1 * | 10/2003 | Ligon | 257/413 |
| 6,686,282 B1 | 2/2004 | Simpson et al. | |
| 2003/0190426 A1 * | 10/2003 | Padhi et al. | 427/307 |
| 2004/0198003 A1 * | 10/2004 | Yeo et al. | 438/284 |
| 2004/0256732 A1 * | 12/2004 | Liaw | 257/774 |

OTHER PUBLICATIONS

B. Doyle, B. Boyanov, S. Datta, M. Doozy, S. Hareland, B. Jin, J. Kavalieros, T. Linton, R. Rios, and R. Chau. Tri-Gate Fully-Depleted CMOS Transistors: Fabrication, Design and Layout, PowerPoint Presented at the 2003 Symposia of VLSI Technology and Circuits, printed from Intel Website: www.intel.com.
Sergey Lopatin. Electrochemical metallization of nanostructures: Integrated circuits and micro-electro-mechanical systems. Recent Res. Devel. Electrochem, 6(2003): 57-100 ISBN: 81-7895-107-X.

* cited by examiner

*Primary Examiner*—Walter L. Lindsay, Jr.
(74) *Attorney, Agent, or Firm*—Mikio Ishimaru

(57) ABSTRACT

A method for manufacturing a transistor is provided. The transistor has a substrate with an insulator on the substrate. A structure on the insulator having a structure sidewall is provided with spacers covering a portion of the structure sidewall. An exposed portion of the structure sidewall is activated, and a conformal layer of metal or metal containing material is deposited on the exposed portion of the structure sidewall. The metal or metal containing material is annealed to diffuse into the exposed portion of the structure sidewall to form a salicide.

12 Claims, 3 Drawing Sheets

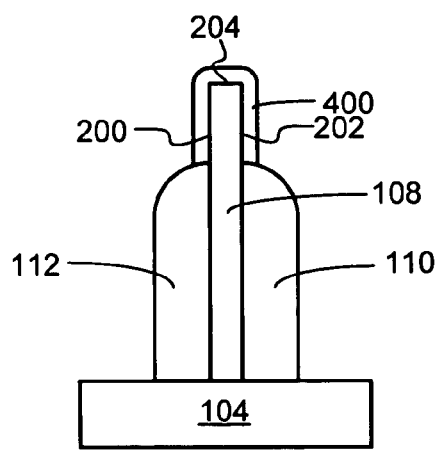
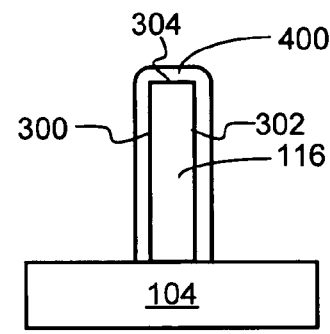
FIG. 4
FIG. 5
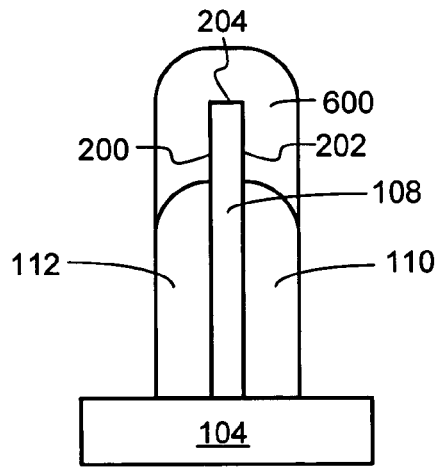
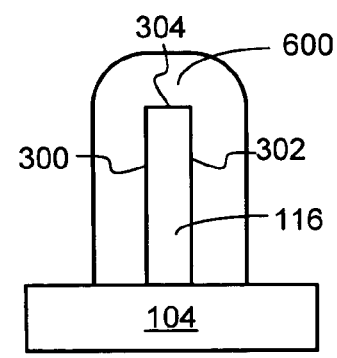
FIG. 6
FIG. 7
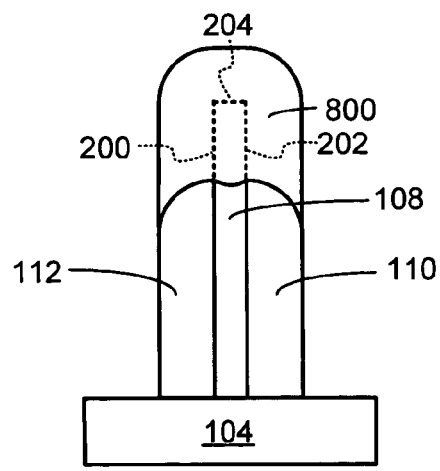
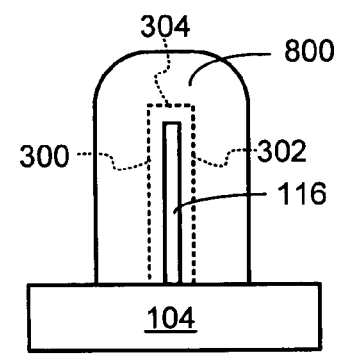
FIG. 8
FIG. 9

METHOD AND APPARATUS FOR TRANSISTOR SIDEWALL SALICIDATION

TECHNICAL FIELD

The present invention relates generally to transistors, and more particularly to a method and apparatus for fin field effect transistors.

BACKGROUND ART

Transistors are used in most portable electronic products such as cell phones, portable computers, voice recorders, etc., as well as in many larger electronic systems such as cars, planes, industrial control systems, etc. In the electronics industry, there have been constant challenges in trying to reduce the size of the devices in which the transistors are used and in the size of the transistors themselves.

One challenge of size reduction has been addressed by very large scale integration (VLSI) where there has been increasing integration of complementary metal oxide semiconductor field effect transistors (CMOS FETs).

However, reducing or scaling CMOS FETs has reached a critical junction. There are currently two main options for the next generation of transistor architectures: planar and three-dimensional architectures. A planar architecture requires the introduction of many new materials, e.g., new gate dielectrics, and new gate electrode materials. Further, structural changes are required such as elevated source/drain regions. Three-dimensional architectures have fewer disadvantages and have the advantages of increased drive current per unit area of silicon (Si) by increasing the channel width in the vertical third dimension, rather than only within the two-dimensional plane of the substrate.

One type of three dimensional architecture FET that allows increased device density is a "FinFET". In a FinFET, the body of the transistor is formed with vertical structures, which individually resemble the dorsal "fin" of a fish. The gate of the FinFET has a vertical gate electrode with sidewall spacers and the source/drain fins are formed on either side of the sidewall spacers.

A FinFET has numerous advantages over a planar architecture FET including nearly ideal turn-off in sub-threshold voltages, giving lower off-currents and/or allowing lower threshold voltages, no loss to drain currents from body effects, no floating body effects (often associated with some Silicon on Insulator (SOI) FETs), higher current density, lower voltage operation, and reduced short channel degradation of threshold voltage and off-current. Thus, a FinFET provides better current control without requiring increased device size, and facilitates scaling of CMOS dimensions while maintaining acceptable performance.

However, it has been found that FinFETs are subject to various disadvantages. For example, deposition processes used to form the salicides, which electrically connects metal contacts to the silicon of the FinFET gate electrode and source/drain fins, only deposit metal on the top regions of these structures. This has been found to result in breaks in the gate electrode salicide leading to high-resistance gates and excessively high source/drain resistances.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing a transistor having a substrate, an insulator on the substrate, a structure on the insulator having a structure sidewall, and a spacer covering a portion of the structure sidewall. An exposed portion of the structure sidewall is activated, and a conformal layer of metal or metal containing material is deposited on the exposed portion of the structure sidewall. The metal or metal containing material is annealed to diffuse into the exposed portion of the structure sidewall to form a salicide.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 4 is the structure of FIG. 2 after activation in accordance with an embodiment of the present invention;

FIG. 5 is the structure of FIG. 3 after activation in accordance with an embodiment of the present invention;

FIG. 6 is the structure of FIG. 4 after deposition in accordance with an embodiment of the present invention;

FIG. 7 is the structure of FIG. 5 after deposition in accordance with an embodiment of the present invention;

FIG. 8 is the structure of FIG. 6 after formation of salicide in accordance with an embodiment of the present invention;

FIG. 9 is the structure of FIG. 7 after formation of salicide in accordance with an embodiment of the present invention;

BEST MODE FOR CARRYING OUT THE INVENTION

Figure 1:
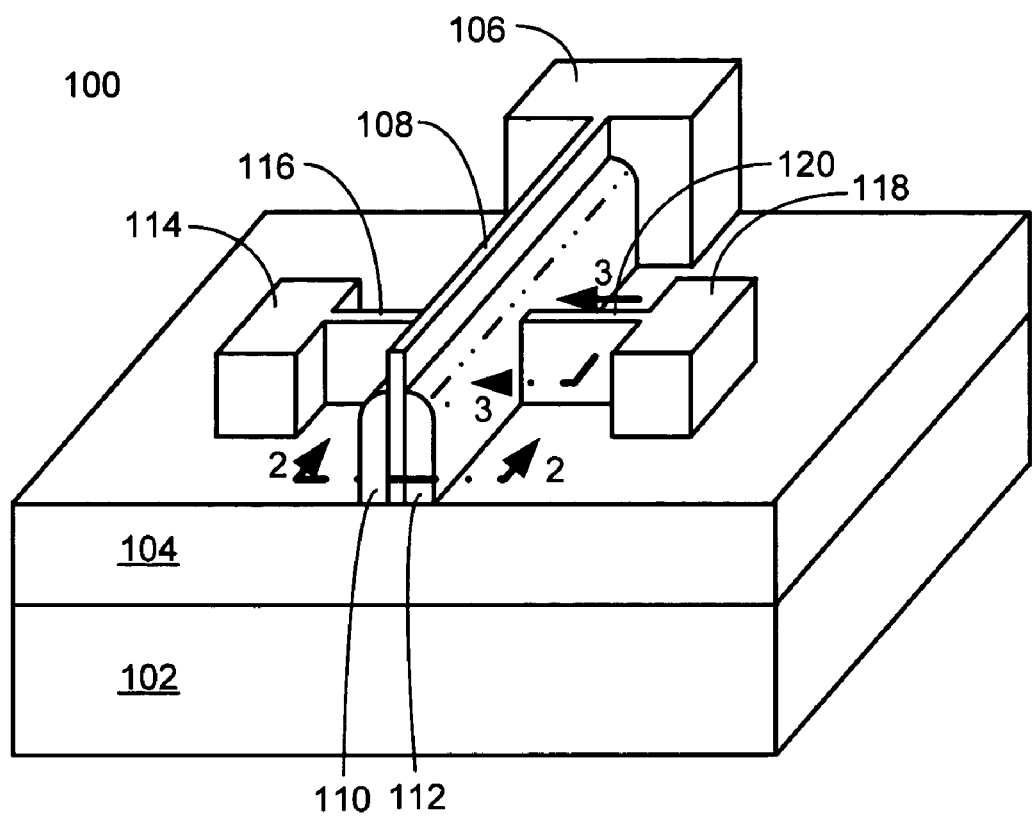
FIG. 1 is a perspective of a FinFET transistor in accordance with an embodiment of the present invention.

In the following description, numerous specific details are given to provide a thorough understanding of the invention. However, it will be apparent that the invention may be practiced without these specific details. In order to avoid obscuring the present invention, some well-known circuitry and process steps are not disclosed in detail.

Likewise, the drawings showing embodiments of the transistor are semi-diagrammatic and not to scale and, particularly, some of the dimensions are for the clarity of presentation and are shown greatly exaggerated in the FIGs.

In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the transistor, regardless of its orientation. The term "vertical" refers to a direction perpendicular to the horizontal as just defined.

Terms, such as "on", "above", "below", "bottom", "top", "side" (as in "structure sidewall", which is vertical to the substrate), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a perspective of a FinFET 100 in accordance with an embodiment of the present invention. The FinFET 100 includes a substrate, such as a silicon on insulator (SOI) structure, which includes a substrate 102 and an insulator, such as a buried oxide layer 104. The substrate can be of a material such as silicon and the buried oxide layer 104 represents a number of high dielectric constant insulating materials.

A gate 106 having a gate electrode 108 is formed over the buried oxide layer 104. The gate 106 can be of a material such as polysilicon, silicon germanium, etc. On either side of the gate electrode 108 are spacers 110 and 112, which are of materials such as nitride, oxide, oxy-nitride, etc.

Also formed on the buried oxide layer 104 are a source/drain 114 having a source/drain fin 116 and a source/drain 118 having a source/drain fin 120. The source/drains 114 and 118 can be of material of a conductive material such as doped silicon.

The gate electrode 108 and the source/drain fins 116 and 120 have high-aspect ratios, or height to thickness, such as 3:1, 4:1, and above 5:1. The present invention becomes increasingly advantageous as the aspect ratios increase above 5:1.

As the size of the gate electrode 108 and the source/drain fins 116 and 120 have continued to get smaller, it has been discovered that saliciding all of the exposed areas of the gate 106 including the gate electrode 108 and the source/drains 114 and 118 including the source/drain fins 116 and 120 is desirable in order to lower the overall resistance.

It also has been discovered in one embodiment that electroless deposition (ELD) is ideal for this application because it forms conformal metal and metal containing films on silicon and polysilicon while being selective to efficiently only deposit on silicon and polysilicon with no deposition on other areas such as the buried oxide layer 104 or the spacers 110 and 112.

Figure 2:
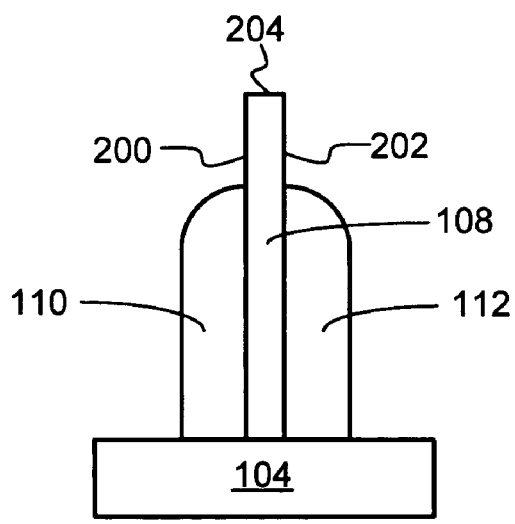
FIG. 2 is a cross-sectional view of FIG. 1 taken along line 2—2 showing a portion of buried oxide with a gate electrode having spacers on either side.

Referring now to FIG. 2, therein is shown a cross-sectional view along line 2—2 of FIG. 1 showing a portion of the buried oxide layer 104 with the gate electrode 108 having spacers 110 and 112 on either side. The gate electrode 108 has exposed structure sidewalls 200 and 202, and a top 204.

Figure 3:
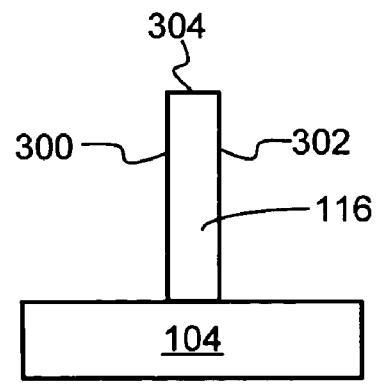
FIG. 3 is a cross-sectional view of FIG. 1 taken along line 3—3 showing buried oxide with a source/drain fin.

Referring now to FIG. 3, therein is shown a cross-sectional view of line 3—3 of FIG. 1 showing the buried oxide layer 104 having the source/drain fin 116. The source/drain fin 116 has structure sidewalls 300 and 302 and a top 304. The source/drains 114 and 118 are similar so the source/drain fin 116 shows an embodiment of the present invention, which is applicable to the source/drain fin 120 as well as being exemplary of structures and FinFETs having multiple pairs of source/drains.

Referring now to FIGS. 4 and 5, therein are shown the structures of FIGS. 2 and 3, respectively, after activation in accordance with an embodiment of the present invention. The gate electrode 108 has exposed structure sidewalls 200 and 202 with the top 204 and the source/drain 116 fin has the structure sidewalls 300 and 302 with the top 304 all have activated surfaces having activating nuclei 400 thereon.

In one embodiment, the activated surfaces are covered by a high-density palladium (Pd) nuclei with a size of 10–15 Å. The activation is accomplished by application by spray of or immersion in an ionic solution of palladium, or by atomic layer deposition (ALD) using a vapor precursor containing palladium.

Referring now to FIGS. 6 and 7, therein are shown the structures of FIGS. 4 and 5, respectively, after deposition of a conformal layer 600 in accordance with an embodiment of the present invention. The conformal layer 600 is a metal or metal containing material deposited on and bonded to the activated surfaces of the exposed structure sidewalls 200 and 202 and the top 204 of the gate electrode 108 and to the structure sidewalls 300 and 302 and the top 304 of the source/drain fin 116.

It has been discovered that electroless deposition provides one method for depositing a highly conformal layer 600 of the metal or metal containing material on the gate 106 and the source/drains 114 and 118. Unlike many other processes, the electroless deposition will form these highly conformal and uniform layers on vertical structure sidewalls of conductive silicon and not on insulating silicon oxides and silicon nitrides.

Various metal and metal containing materials that can be deposited by electroless deposition include nickel (Ni), cobalt (CO), boron (B), or phosphorous (P) singularly or in combinations such as the following:
1. Ni, Ni—P, Ni—B, Ni—P—B
2. Co, Co—P, Co—B, Co—P—B
3. Ni—Co, Ni—Co—P, Ni—Co—B, Ni—Co—P—B.

The electroless deposition will form a conformal layer of between 50–200 Å thickness.

Referring now to FIGS. 8 and 9, therein are shown the respective structures of FIGS. 6 and 7, respectively, after salicidation in accordance with an embodiment of the present invention. The metal or metal containing material is combined with the material of the exposed structure sidewalls 200 and 202 and the top 204 of the gate electrode 108 and with the material of the structure sidewalls 300 and 302 and the top 304 of the source/drain fin 116 to form a self-aligned metal silicide or salicide 800 where the gate 106 is of polysilicon and the source/drains 114 and 118 are of silicon (FIG. 1).

The salicide 800 will be formed of silicides, singularly or in combinations, of the deposited metal or metal containing material, such as the following:
1. Ni, Ni—P, Ni—B, Ni—P—B
2. Co, Co—P, Co—B, Co—P—B
3. Ni—Co, Ni—Co—P, Ni—Co—B, Ni—Co—P—B.

The thickness of the salicide 800 is between 70 and 500 Å.

It will be understood that all the exposed silicon areas such as the polysilicon of the gate 106 and the silicon of the source/drains 114 and 118 will be salicided but the salicide will not be on the oxide or nitride of the spacers 110 or 112, or the buried oxide 104.

Figure 10:
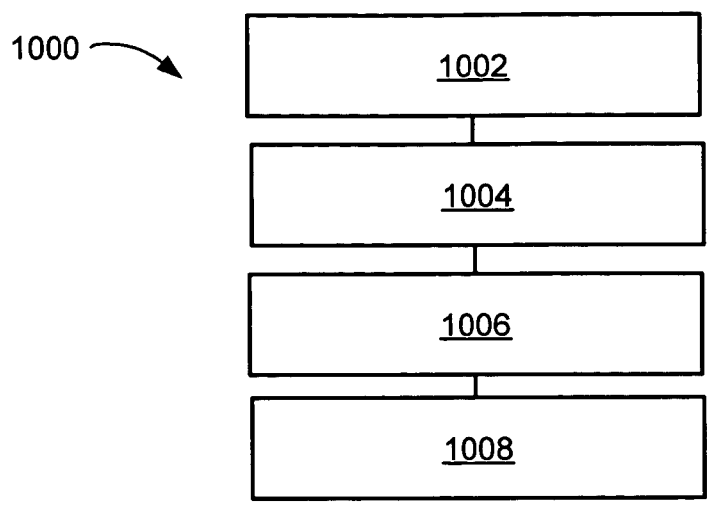
FIG. 10 is a method for manufacturing a transistor in accordance with an embodiment of the present invention.

Referring now to FIG. 10, therein is shown a method 1000 for manufacturing a transistor in accordance with an embodiment of the present invention. The method 1000 comprises: providing the transistor having a substrate, an insulator on the substrate, a structure on the insulator having a structure sidewall, and a spacer covering a portion of the structure sidewall in a block 1002; activating an exposed portion of the structure sidewall in a block 1004; depositing a conformal and uniform layer of a metal or metal containing material on the exposed portion of the structure sidewall in a block 1006; and annealing the metal or metal containing material to diffuse into the exposed portion of the structure sidewall to form a salicide in a block 1008.

Figure 11:
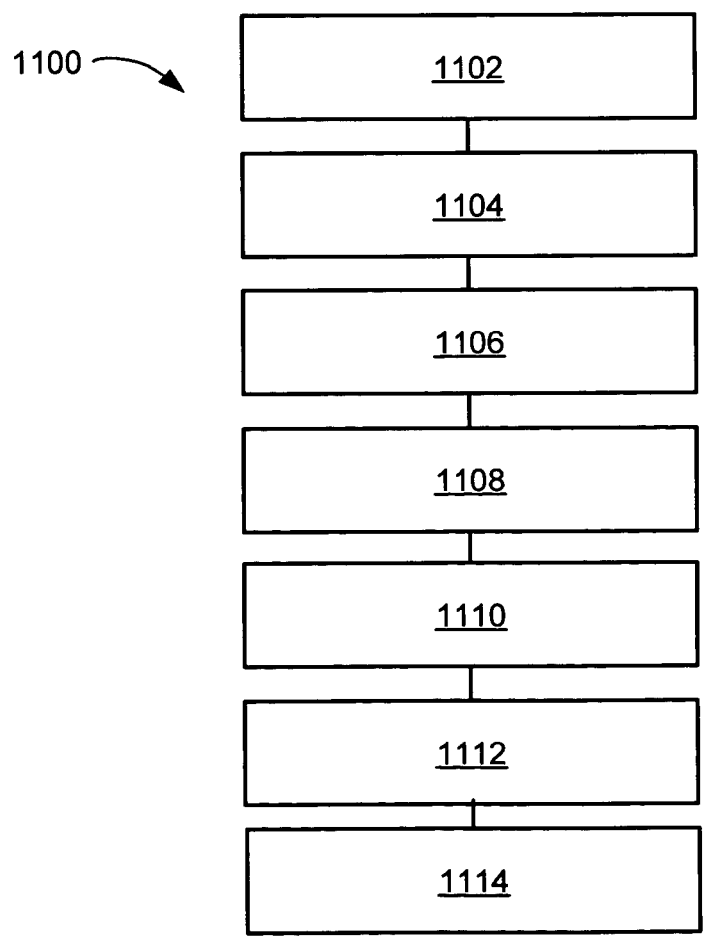
FIG. 11 is a method for manufacturing a FinFET in accordance with an embodiment of the present invention.

Referring now to FIG. 11, therein is shown a method 1100 for manufacturing a FinFET in accordance with an embodiment of the present invention. The method 1100 comprises: providing the transistor having a substrate, an insulator on the substrate, a gate on the insulator including a gate electrode having a vertical structure sidewall, a spacer covering a portion of the vertical structure sidewall, and a source/drain on the insulator including a fin having a vertical structure sidewall in a block 1102; pre-cleaning in a block 1104; surface activation in a block 1106; a post-activation cleaning in a block 1108; electroless deposition in a block 1110; post-deposition cleaning in a block 1112; and an annealing salicidation in a block 1114.

In the block 1104, the pre-cleaning removes oxide, nitride, oxynitride, and oxide-nitride-oxide (ONO) from silicon surfaces. It has been discovered that citric acid works unexpectedly well in cleaning solutions used with various embodiments of the present invention. For example, one excellent pre-cleaning solution found comprises 15–20 g/l of 100% citric acid and 5–10 ml/l of 48–49% hydrofluoric acid in about 1 liter of de-ionized water. The pre-cleaning solution is adjusted to an acidic solution with a pH of about 3. The rinse and pre-clean solution is followed by a de-ionized water rinse.

In the surface activation block 1106, an activation solution rinse is used. It has been discovered that palladium works well in activation solutions used with various embodiments of the present invention. For example, one exemplary activation solution found comprises 0.2–0.5 ml/l of 5% palladium chloride ($PdCl_2$), 1–3 ml/l of 36% hydrochloric acid (HCl), and 5 ml/l of 48% hydrofluoric acid (HF) in about 1 liter of de-ionized water. The activation solution is adjusted to an acidic solution with a pH of about 3. The activation solution rinse is followed by a de-ionized water rinse for 5–15 seconds.

In the post-activation cleaning block 1108, an activation post-cleaning solution is used. It has been discovered that citric acid works unexpectedly well for removing metal ionic contaminants from dielectric surfaces in post-cleaning solutions used with various embodiments of the present invention. For example, one excellent post-cleaning solution found comprises 3–5 g/l of 100% citric acid and 15–20 ml/l of 25% tetramethylammonium hydroxide (TMAH) in about 1 liter of de-ionized water. The post-cleaning solution is adjusted to about a neutral solution with a pH from 6 and 6.5. The post-cleaning solution is followed by a de-ionized water rinse.

In block 1110, the electroless metal deposition is performed using a metal or metal containing solution. It has been discovered that citric acid works unexpectedly well in electroless solutions used with various embodiments of the present invention. For example, one exemplary Ni—Co—P electroless deposition solution found comprises 4–7 g/l of $NiCl_2.6H_2O$, 5–7 g/l of $CoCl_2.6H_2O$, 50–65 g/l of 100% citric acid, 15–20 g/l of 50% hydrophosporous acid, 15–25 g/l of hypophosphorous acid, and 15–20 ml/l ammonium hydroxide in about 1 liter of de-ionized water. The deposition solution is adjusted to a basic solution with a pH from 9 to 9.5 and the electroless deposition is performed at a temperature from 65–95° C. The electroless deposition is followed by a de-ionized water rinse for 15–30 seconds.

In block 1112, an electroless deposition post-cleaning solution is used. It has been discovered that citric acid works unexpectedly well in the post-cleaning solution. For example, one exemplary post-cleaning solution found comprises 3–5 g/l of 100% citric acid and 15–20 mill of 20–25% ammonium hydroxide in about 1 liter of de-ionized water. The post-cleaning solution is adjusted to about a neutral solution with a pH from 7 to 7.5. The post-cleaning solution is followed by a de-ionized water rinse.

It will be understood that the above formulation ranges are not exact because of the need to adjust pH in a range.

In the block 1114, the annealing for salicidation is performed in an inert ambient such as nitrogen (N), nitrogen-hydrogen (N—H), hydrogen (H), or a vacuum. The temperature will be in a range from 400–600° C. with a preferred temperature range of 400–450° C. with a rapid anneal time of between 1–2 minutes.

It has been discovered that electroless metal deposition provides a number of unexpected advantages including: lower roughness on the structure sidewalls of the FinFET; lower contact resistance; lower sheet resistance on the FinFET structure sidewalls; less silicon consumption; lower film stress; lower process temperatures; much higher than expected conformal coverage of high-aspect ratio structures with uniform films; very clean interfaces; and selective deposition only on silicon surfaces which eliminates the need for metal etch in final cleaning.

Various film metrology/inspection tests are used for assuring production manufacturing surface quality such as atomic force microscopy. Tests for composition and thickness use X-ray fluorescence (XRF) or X-ray reflectrometry (XRR), atomic force microscopy (AFM), and profilometry. A four-point probe is used to determine resistivity.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for manufacturing a transistor, comprising:
providing the transistor having a substrate, an insulator on the substrate, a structure on the insulator having a structure sidewall, and a spacer covering a portion of the structure sidewall;
activating an exposed portion of the structure sidewall;
depositing a conformal layer of a metal or metal containing material on the exposed portion of the structure sidewall wherein depositing uses an electroless deposition process; and
annealing the metal or metal containing material to diffuse into the exposed portion of the structure sidewall to form a salicide.

2. The method as claimed in claim 1 wherein:
activating uses a first process and a first metal; and
depositing the conformal layer uses a second process different from the first process and a second metal different from the first metal.

3. The method as claimed in claim 1 further comprising:
pre-cleaning the structure before activation using a solution containing citric acid.

4. The method as claimed in claim 1 wherein:
depositing uses the metal or metal containing material selected from nickel, cobalt, phosphorous, boron, an alloy thereof, a compound thereof, and a combination thereof.

5. The method as claimed in claim 1 further comprising:
post-cleaning the structure after depositing using a solution containing citric acid.

6. The method as claimed in claim 1 wherein:
annealing is performed in an inert atmosphere or vacuum from about 400° C. to about 600° C. for one to two minutes.

7. A method for manufacturing a transistor, comprising:
providing the transistor having a substrate, an insulator on the substrate, a gate on the insulator including a gate electrode having a vertical structure sidewall, a spacer covering a portion of the vertical structure sidewall, and a source/drain on the insulator including a fin having a vertical structure sidewall;
activating an exposed portion of the gate including an exposed portion of the vertical structure sidewall of the gate electrode and the source/drain including the vertical structure sidewall of the fin wherein activating uses a surface activation process;
depositing a conformal layer of a metal or metal containing material on the gate including the exposed portion of the vertical structure sidewall of the gate electrode and the source/drain including the vertical structure sidewall of the fin, the depositing not depositing the metal or metal containing material on the spacer or the insulator wherein depositing the conformal layer uses an electroless deposition process; and
annealing the metal or metal containing material to form a salicide with the material of the gate including the exposed portion of the vertical structure sidewall of the gate electrode and the source/drain including the vertical structure sidewall of the fin to form a salicide.

8. The method as claimed in claim 7 further comprising:
pre-cleaning the transistor before activation using an acidic solution containing citric acid;
post-cleaning the transistor after activation using an about neutral solution containing citric acid and tetramethylammonium hydroxide.

9. The method as claimed in claim 7 wherein:
depositing uses electroless deposition of the metal or the metal containing material selected from nickel, cobalt, phosphorous, boron, an alloy thereof, a compound thereof, and a combination thereof in a base solution containing citric acid.

10. The method as claimed in claim 7 wherein:
depositing uses an electroless deposition process in a base solution; and
depositing uses an about neutral post-cleaning solution after electroless deposition using a base solution.

11. The method as claimed in claim 7 further comprising:
post-cleaning the structure after depositing using a solution containing citric acid.

12. The method as claimed in claim 7 wherein:
annealing is performed in an inert atmosphere or vacuum from about 400° C. to about 450° C. for one to two minutes.

* * * * *